US007212892B2

(12) United States Patent
Matsui et al.

(10) Patent No.: US 7,212,892 B2
(45) Date of Patent: May 1, 2007

(54) IN-VEHICLE SYSTEM CONTROL DEVICE (75) Inventors: Seika Matsui, Aichi-ken (JP);
Yoshihiro Nakamura, Aichi-ken (JP)

(73) Assignee: Aisin Seiki Kabushiki Kaisha,
Aichi-ken (JP)

( * ) Notice: Subject to any disclaimer, the term of this patent is extended or adjusted under 35 U.S.C. 154(b) by 322 days.

(21) Appl. No.: 10/878,329

(22) Filed: Jun. 29, 2004

(65) Prior Publication Data
US 2004/0267417 A1 Dec. 30, 2004

(30) Foreign Application Priority Data
Jun. 30, 2003 (JP) ............... 2003-186641

(51) Int. Cl.
*G00F 19/00* (2006.01)
(52) U.S. Cl. .......................... 701/31; 701/36
(58) Field of Classification Search ............... None
See application file for complete search history.

(56) References Cited
U.S. PATENT DOCUMENTS
5,200,877 A * 4/1993 Betton et al. ............... 361/92

5,321,389 A * 6/1994 Meister ...................... 340/455
6,066,899 A * 5/2000 Rund et al. ................ 307/10.7
6,624,531 B2 * 9/2003 Disser et al. .............. 307/10.1

FOREIGN PATENT DOCUMENTS
JP 09-125817 A 5/1997
JP 2003-020859 A 1/2003

* cited by examiner

Primary Examiner—Michael J. Zanelli
(74) Attorney, Agent, or Firm—Sughrue Mion, PLLC (57) ABSTRACT An in-vehicle system control device, which controls an in-vehicle system mounted in a vehicle includes an electric load electrically connected to a battery for activating the in-vehicle system, and a judging means electrically connected to the electric load wherein the judging means detects activating voltage of a battery for activating the in-vehicle system by applying a voltage from the battery to the electric load connected to the battery before activating the in-vehicle system, and judges whether or not the battery is in deteriorated condition by comparing a predetermined judging condition.

15 Claims, 8 Drawing Sheets

IN-VEHICLE SYSTEM CONTROL DEVICE

CROSS REFERENCE TO RELATED APPLICATIONS

This application is based on and claims priority under 35 U.S.C. § 119 to Japanese Patent Application 2003-186641, filed on Jun. 30, 2003, the entire content of which is incorporated herein by reference.

FIELD OF THE INVENTION

This invention generally relates to an in-vehicle system control device. More particularly, this invention pertains to a detection method of deterioration of a battery, which activates in-vehicle system of a vehicle.

BACKGROUND

Vehicle electrical components including an in-vehicle system such as a starter motor of an internal combustion engine, an opening and closing device, etc. are activated using a battery. Since the battery can not maintain an appropriate voltage while applying electricity when the battery is deteriorated, the in-vehicle system may not work before the work is completed when the deteriorated battery is used. To prevent such incommodity in operation of the in-vehicle system, appropriate control is needed with considering battery condition for the in-vehicle system.

As an example of such art, a control device of an electrically operated locking/unlocking device is disclosed in Japanese Patent Laid-Open Publication H09-125817 (see paragraphs from 0007 to 0010). In the disclosed art, the control device includes a control means to secure an energy supply for activating a starter motor of internal combustion engine of a vehicle in preference to activation of the electrically operated locking/unlocking device. This control device controls electric power supplied from the battery to secure activatable energy for the starter motor and prevents incommodity in starting of the internal combustion engine.

This control device of the electrically operated locking/unlocking device is used to control and to secure the power source of the starter motor by judging availability of the battery to prevent incommodity at starting of the internal combustion engine. There is no description of power source control effect for preventing incommodity other portion than the starter motor.

SUMMARY OF THE INVENTION

According to an aspect of the present invention, an in-vehicle system control device, which controls an in-vehicle system mounted in a vehicle includes an electric load electrically connected to a battery for activating the in-vehicle system, and a judging means electrically connected to the electric load wherein the judging means detects activating voltage of a battery for activating the in-vehicle system by applying a voltage from the battery to the electric load connected to the battery before activating the in-vehicle system, and judges whether or not the battery is in deteriorated condition by comparing a predetermined judging condition.

It is preferable that the electric load is composed of singular load device.

It is preferable that at least one electric component forming the in-vehicle system is not activated with turning on the electric load.

It is preferable that the in-vehicle system is not activated by the battery when the judging means detects deterioration of the battery.

It is preferable that the judging means changes setting of an intrinsic constant for controlling the in-vehicle system when the judging means detects deterioration of the battery.

It is preferable that detection of battery deterioration is prohibited when the judging means detects deterioration of the battery, and the in-vehicle system is not activated by the battery until an internal combustion engine of the vehicle is activated.

It is preferable that detection of battery deterioration is prohibited when the judging means detects deterioration of the battery, and the judging means changes setting of an intrinsic constant for controlling the in-vehicle system until an internal combustion engine of the vehicle is activated.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

A preferred embodiment of the present invention will be described hereinbelow in detail with reference to the accompanying drawings.

Figure 1:
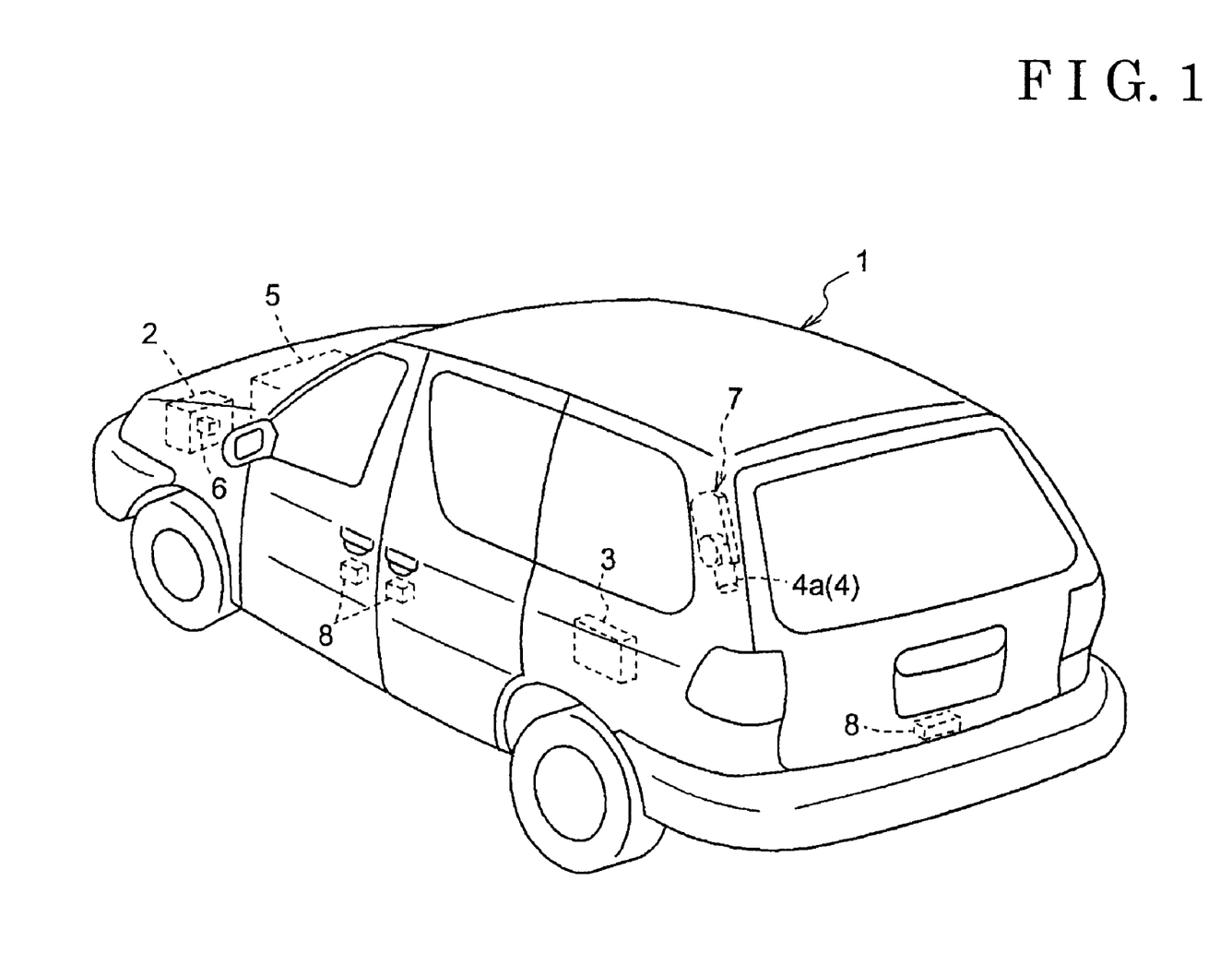
FIG. 1 is a backside perspective view of a vehicle applyed an in-vehicle system control device according to embodiments of the present invention.

FIG. 1 shows a backside perspective view of a vehicle 1 applied an in-vehicle system control device according to embodiments of the present invention. The vehicle 1 includes an in-vehicle system including an internal combustion engine (engine 5), a door closer 7, and a locking/unlocking mechanism 8, and an in-vehicle controller 3. Controlling function of the in-vehicle controller 3 to the in-vehicle system etc. is realized using a software and a hardware. The in-vehicle controller 3 may control the engine 5. The in-vehicle system includes electrical components such as a starter motor of the engine 5, the door closer 7, the locking/unlocking mechanism 8, a hazard lamp, a room light, and a walker detection sensor.

Figure 2:
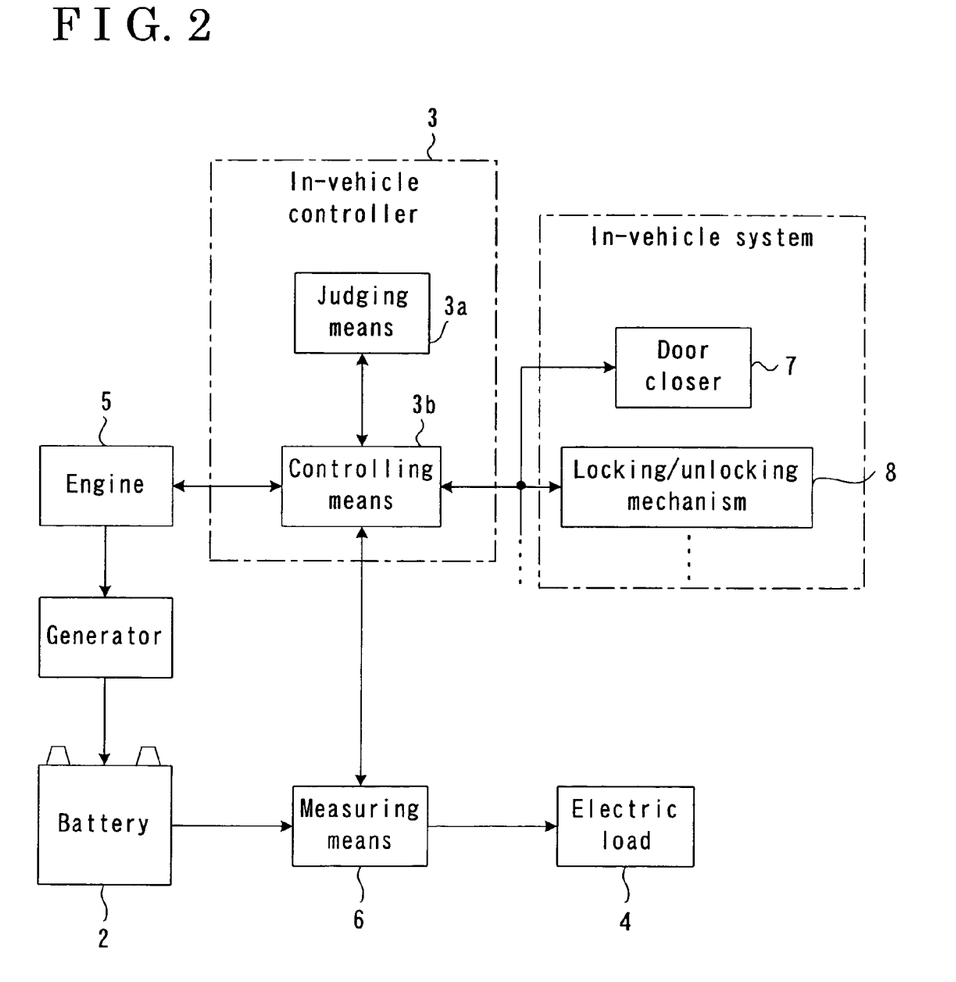
FIG. 2 is a block diagram illustrating an in-vehicle system control device according to embodiments of the present invention.

(First embodiment) Hereinafter, a first embodiment of the in-vehicle system control device according to the present invention will be explained using FIG. 1 and FIG. 2. In the first embodiment, to judge deterioration of a battery 2, activating voltage of the battery 2 is measured with applying voltage to an electric load 4 composed of singular member before activating the in-vehicle system.

In the first embodiment, an actuator 4a (motor) of the door closer 7 is used as an example of the electric load 4. As shown in FIG. 2, the actuator 4a is electrically connected to the battery 2 through a measuring means 6 (explained later), and composed to supply electric current (for example, 2–3 ampere) when voltage is applied from the battery. The actuator 4a actuates in response to command from the in-vehicle controller 3 (explained later). While the actuator 4a is used as the electric load 4, the door closer 7 is actuated so as to close the door by the actuator 4a when the door is closing, and the door closer 7 is actuated so as to open the door by the actuator 4a when the door is opening. The door is not moved in this condition.

The battery 2 is a common battery used for vehicles with 12 volts of rated voltage and activates each in-vehicle system of the vehicle 1. The measuring means 6 measures activation voltage of the battery 2 based on the command from the in-vehicle controller 3 (explained later) while the actuator 4a is activated. The measured activation voltage data is outputted to the in-vehicle controller 3. Timing and number of measurement of the activation voltage are set with considering a required time from activation start to reach stable condition, effect of noise, and so on.

The function for realizing the first embodiment of the present invention is included in the in-vehicle controller 3 with a function for monitoring whether or hot the engine 5 is working (number of revolutions) and control function of the in-vehicle system and the measuring means 6.

The in-vehicle system control device according to the first embodiment includes the measuring means 6 for measuring activation voltage of the battery 2, a judging means 3a for judging whether or not the battery 2 is in deteriorated condition, and a controlling means 3b for processing to the in-vehicle system based on deterioration judgment of the battery 2.

The judging means 3a judges whether or not the battery 2 is in deteriorated condition (deterioration judgment) after obtaining a measurement data from the measuring means 6 through the controlling means 3b. The deterioration judgment is conducted by comparing an activating voltage E of the measured data with a threshold voltage Es. If the activating voltage E is lower than the threshold voltage Es, the judging means 3a judges that the battery 2 is deteriorated. If measured data are plural, judgment is carried out individually. In this situation, the activating voltage E may be estimated using plural measured data, and judgment may be conducted by comparing the estimated activating voltage E with the threshold voltage Es. In addition, deterioration judgment may be carried put in case of that a rate of voltage drop estimated from the measured data is larger than predetermined value.

Controlling means 3b controls deterioration judgment of the battery and controls the in-vehicle system in response to judgment of the judging means 3a. Further, the controlling means 3b verifies operating state of the engine 5 if required. Specifically, the controlling means 3b monitors system operation request to the in-vehicle system activated by the battery 2 and controls activation of the actuator 4a. In addition, the controlling means 3b receives the measured data for activation voltage of the battery 2 measured by the measuring means 6 and transmits the measured data to the judging means 3a. If deterioration of the battery 2 is not detected according to judgment from judging means 3a, the controlling means 3b permits activation of the in-vehicle system requested. If deterioration of the battery 2 is detected activation of the in-vehicle system is prohibited, and incommodity caused by stopping operation of the in-vehicle activating until then may be prevented.

Figure 3:
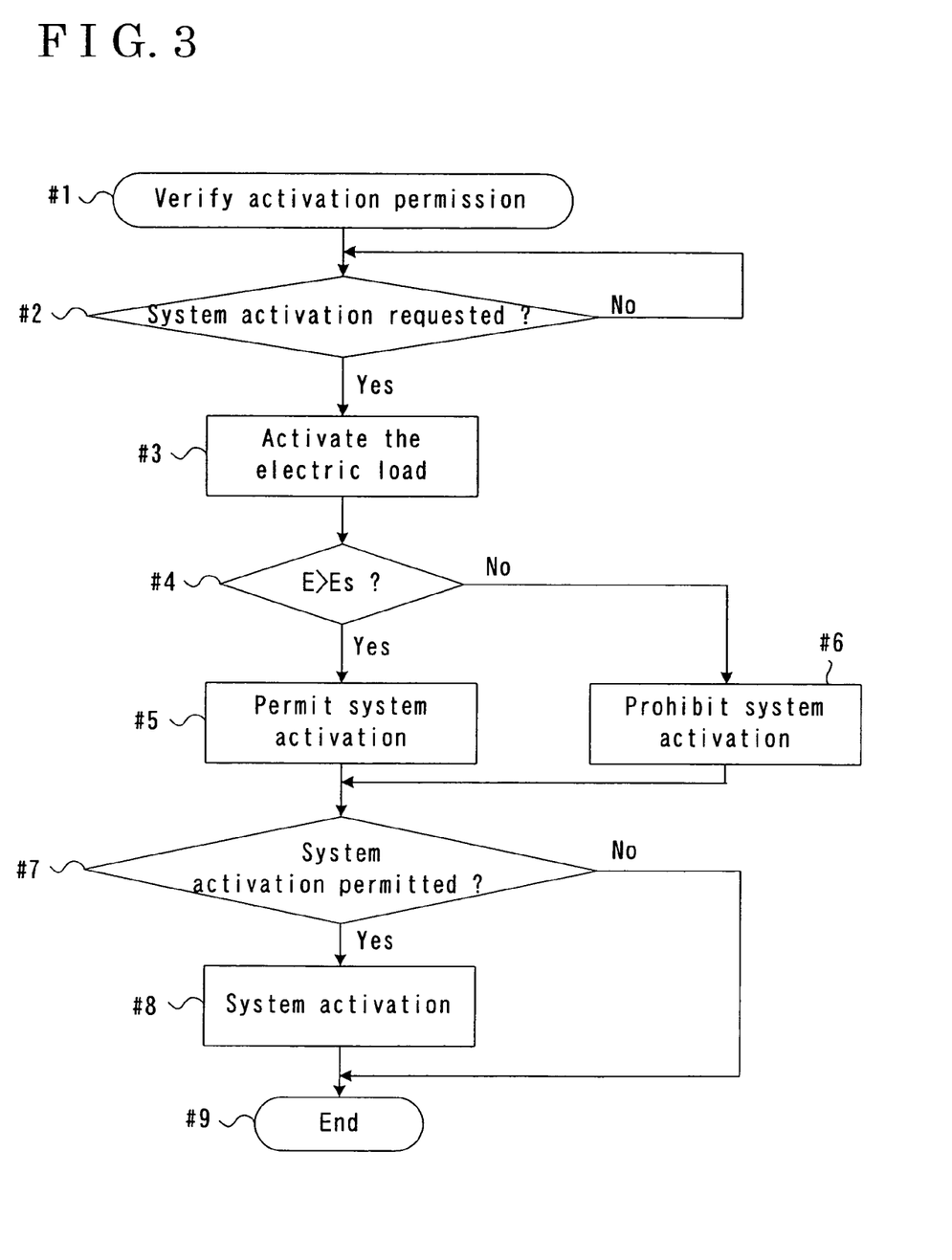
FIG. 3 is a flow chart of a first embodiment of an in-vehicle system control device according to the present invention.

(Deterioration judgment and in-vehicle system control) Next, a process for deterioration judgment of the battery 2 and in-vehicle system controlling according to the first embodiment of the present invention will be explained with reference to FIG. 3. If deterioration of the battery 2 is detected according to judgment from judging means 3a, activation of the in-vehicle system is prohibited.

First, the in-vehicle system control device verifies activation permission for the in-vehicle system, which performs deterioration judgment, prior to activation (step #1). If the in-vehicle system is activation permission state, the in-vehicle system control device monitors whether or not system activation request is carried out to the in-vehicle system (step #2). If system activation has been requested (namely, the door closer 7 has been requested to activate in the first embodiment), the electric load 4 (namely the actuator 4a) is activated by applying voltage from the battery 2 (step #3). In this step, the electric load 4 is composed so that electric component of the in-vehicle system is not operated even if the electric load is activated. In other wards, the actuator 4a is activated without moving the door in the first embodiment of the present invention. If the door is closed, the actuator 4a is activated so as to close the door. If the door is opened, the actuator 4a is activated so as to open the door, Further, the judging means 3a measures the activation voltage E of the battery 2.

Further, deterioration judgment of the battery 2 is carried out by comparing the activation voltage of the battery 2 with the threshold voltage Es (step #4). If the activation voltage E is higher than the threshold value Es, a system activation permission flag is set (step #5). If the activation voltage E is not higher than the threshold value Es, a system activation prohibition flag is set (step #6). Next, the system activation flag is confirmed (step #7). If the system activation permission flag is set, the door closer 7, which is requested to operate, is activated (step #8). If the system activation prohibition flag is set, the door closer 7, which is requested to operate, is not activated. Then process is ended (step #9).

(Second embodiment) Next, a second embodiment of an in-vehicle system control device according to the present invention will be explained. In the second embodiment, deterioration judgment is carried out using a load device (electric load) in which the in-vehicle system is not operated even if it is activated whereas singular load device is used as the electric load 4 in the above described first embodiment.

A hazard lamp, a room light, a walker detection sensor, et al. may be used as an example of the electric load 4 according to the second embodiment. These electric loads are composed to pass an electric current (for example, 2–3 ampere) when a voltage from the battery 2 is applied. In the second embodiment, assortment of plural electric loads may be used when it is difficult to obtain sufficient voltage characteristic required to judge whether or not the battery 2 is deteriorated since electric resistance of singular load device (electric load) is low.

Figure 4:
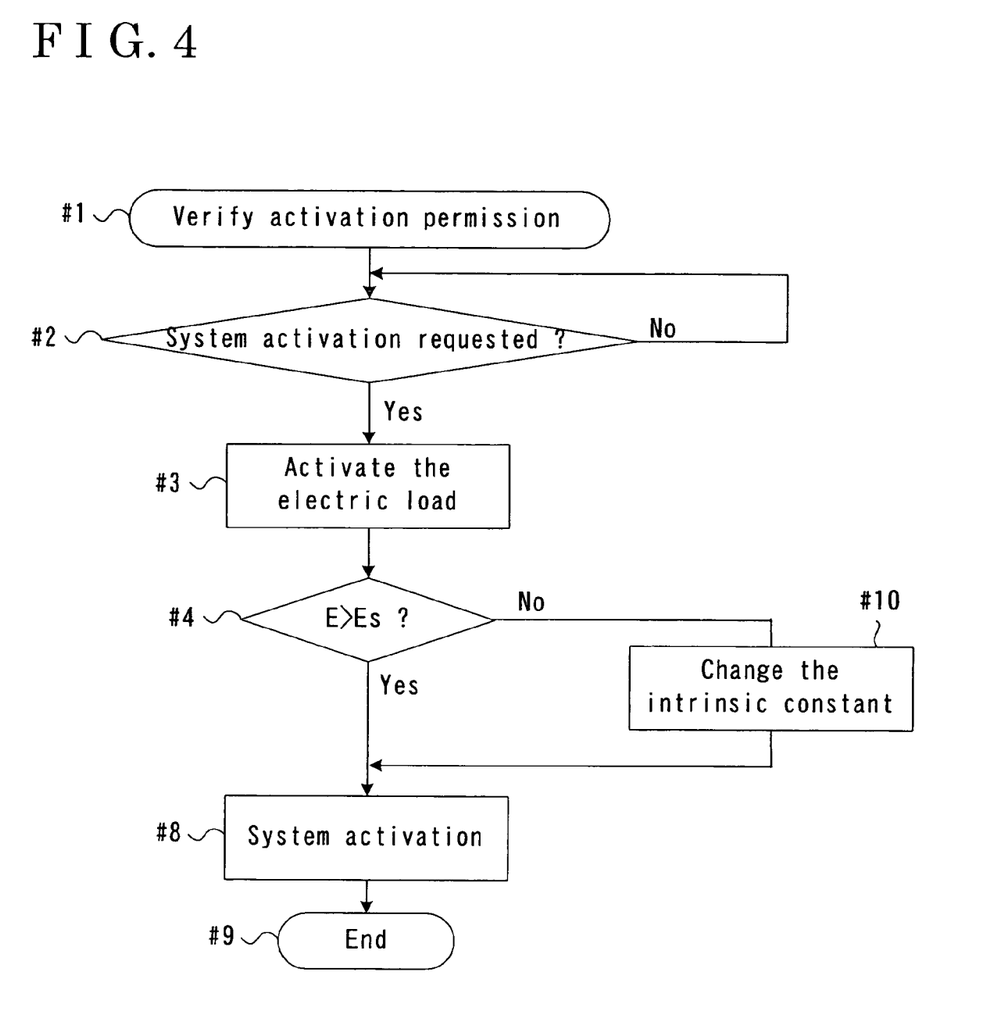
FIG. 4 is a flow chart of a third embodiment of an in-vehicle system control device according to the present invention.

(Third embodiment) Next, a third embodiment of the in-vehicle system control device according to the present invention will be explained. In the third embodiment, an intrinsic constant for controlling the in-vehicle system is changed when the in-vehicle system control device detects deterioration of the battery 2 using a judging means 3a when deterioration judgment and controlling of the in-vehicle system are carried out whereas activation of the in-vehicle system is prohibited in the first embodiment. The third embodiment is applied to the in-vehicle system wherein the subject of system activation request is preferred to work even if the battery 2 is deteriorated. In addition, an actuator 4a is used as an example of the electric load, and a door closer 7 is used as the in-vehicle system as same as the first embodiment.

A process for deterioration judgment of the battery 2 and in-vehicle system controlling according to the third embodiment of the present invention will be explained with reference to FIG. 4.

First, as same as the first embodiment, the in-vehicle system control device verifies activation permission for the in-vehicle system, which performs deterioration judgment, prior to activation (step #1). If the in-vehicle system is activation permission state, the in-vehicle system control device monitors system activation request to the in-vehicle system (step #2). If system activation has been requested, the electric load 4 is activated by applying voltage from the battery 2 (step #3). Further, the judging means 3a measures activation voltage E of the battery 2.

Further, deterioration judgment of the battery 2 is carried out by comparing the activation voltage of the battery 2 with the threshold voltage Es (step #4). If the activation voltage E is higher than the threshold value Es, the intrinsic constant for controlling the in-vehicle system is changed (step #10). In this step, for example, if the door closer 7 is requested to operate and door opening/closing speed is set as an intrinsic constant for controlling the in-vehicle system, setting of door opening/closing speed is changed to slower speed. This behavior is introduced to the following effect. Namely, the door has a tendency to open/close quickly when the battery 2 is deteriorated. For the intrinsic constant for controlling the in-vehicle system, acceleration, time, electric current (electric current passing the actuator) with door opening/closing operation may be used as door trouble detection and a constant which serves as a threshold for controlling. Next, the door closer 7, which is requested to operate, is activated (step #8). Then process is ended (step #9). A second threshold value may be set to prohibit actuation of the door closer 7 if the activation voltage is low and prohibited actuation of the door closer 7 is preferable.

Figure 5:
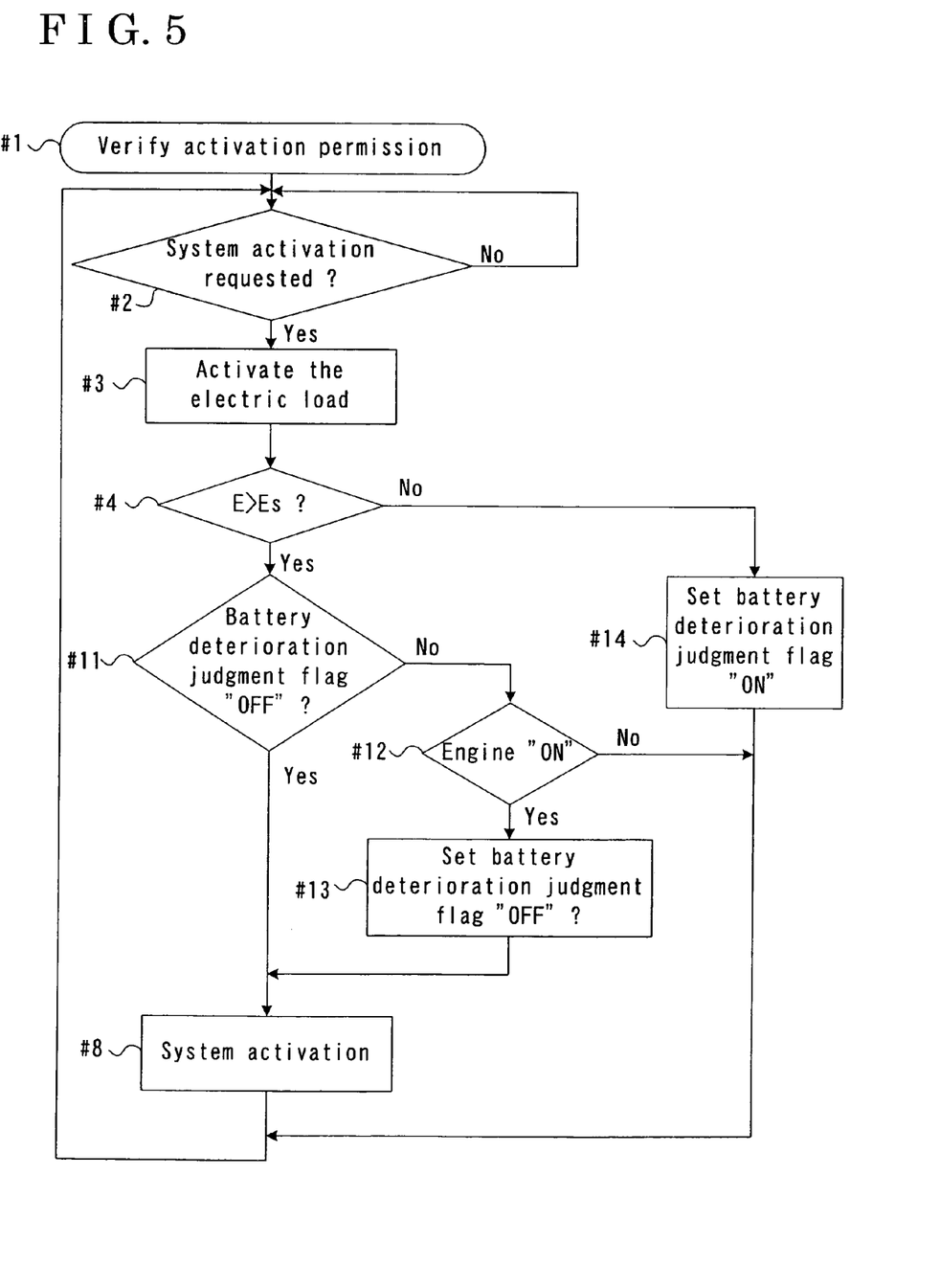
FIG. 5 is a flow chart of a fourth embodiment of an in-vehicle system control device according to the present invention.

(Fourth embodiment) Next, a fourth embodiment of the in-vehicle system control device according to the present invention will be explained. In the fourth embodiment, deterioration detection of the battery 2 is interrupted when deterioration of the battery 2 is detected by the judging means 3a. Further, activation of the in-vehicle system is prohibited until the engine 5 works. If an alternator provided in the vehicle functions normally, the battery 2 is charged with working of the engine 5, and the activation voltage is secured. Thus, not only detection of the battery availability but also working condition of the engine 5 is set as awaking condition for prohibiting in-vehicle system activation. It may prevent failure of an electric generator such as the alternator. In addition, an actuator 4a is used as an example of the electric load, and a door closer 7 is used as the in-vehicle system as same as the first embodiment.

A process for deterioration judgment of the battery 2 and in-vehicle system control according to the fourth embodiment of the present invention will be explained with reference to FIGS. 5.

First, as same as the first embodiment, the in-vehicle system control device verifies activation permission for the in-vehicle system, which performs deterioration judgment, prior to activation (step #1). If the in-vehicle system is activation permission state, the in-vehicle system control device monitors system activation request to the in-vehicle system (step #2). If system activation has been requested, the electric load 4 is activated by applying voltage from the battery 2 (step #3). Further, the judging means 3a measures the activation voltage E of the battery 2.

Further, deterioration judgment of the battery 2 is carried out by comparing the activation voltage of the battery 2 with the threshold voltage Es (step #4). If the activation voltage F is higher than the threshold value Es, the in-vehicle system control device confirms whether or not a deterioration judgment flag is set to "OFF" (step #11). If the deterioration judgment flag is set to "OFF", the door closer 7 is activated (step #8). If the deterioration judgment flag is set to "ON", the in-vehicle system control device confirms whether or not the engine 5 is working (step #12). When the engine 5 is working, setting of the deterioration judgment flag is changed to "off" (step #13), and the door closer 7 is activated (step #8). In the step #12, when the engine 5 is not working, the process goes back to the step #2 which is the monitoring step of the in-vehicle system activation. In the step #4, if the activation voltage E is lower than or equal to the threshold value Es, the deterioration judgment flag of the battery 2 is set to "ON" (step #14), and go back to the step #2 which is the monitoring step of the in-vehicle system activation.

Figure 6:
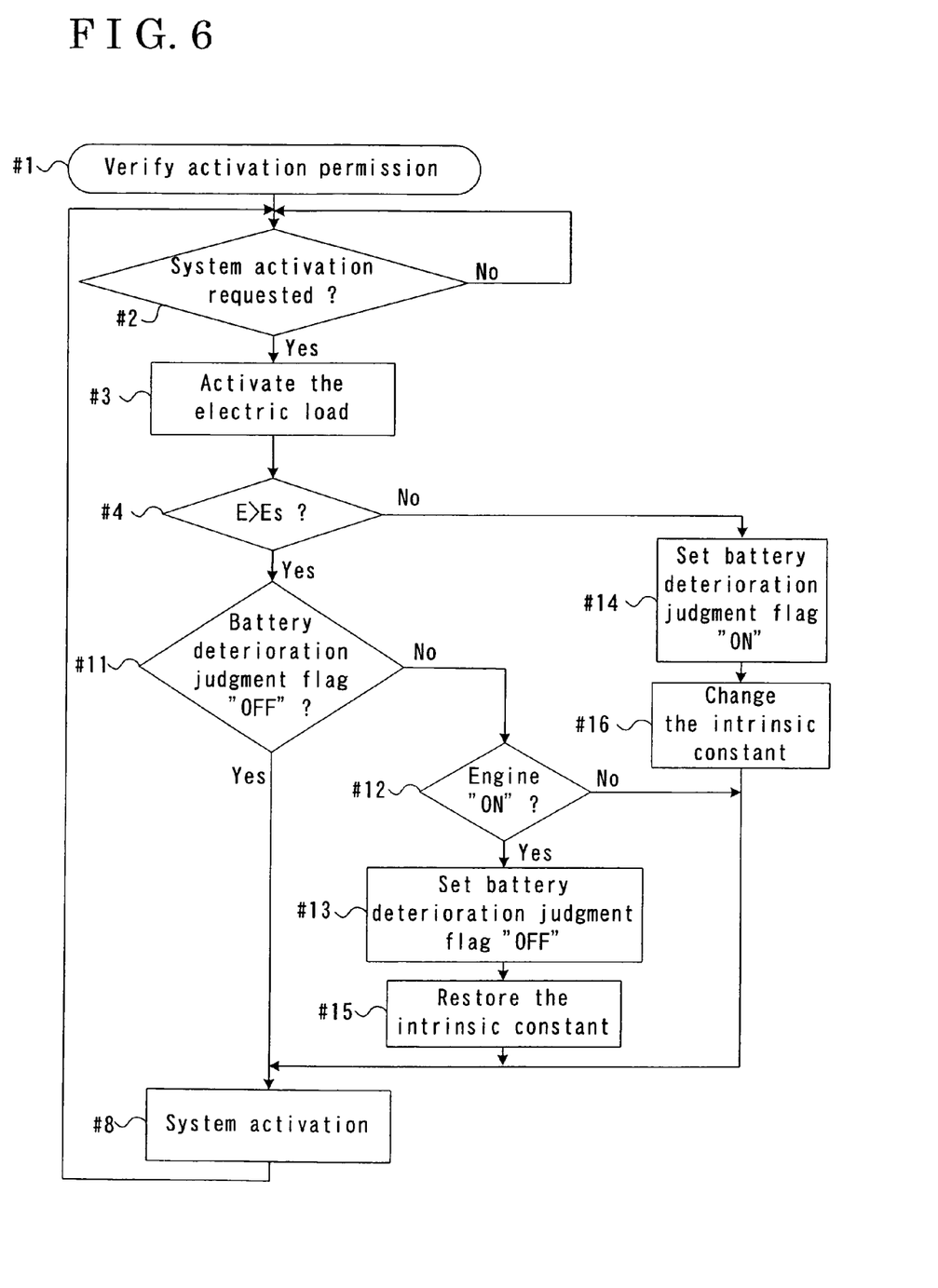
FIG. 6 is a flow chart of a fifth embodiment of an in-vehicle system control device according to the present invention.

(Fifth embodiment) Next, a fifth embodiment of the in-vehicle system control device according to the present invention will be explained. In the fifth embodiment, deterioration detection of the battery 2 is interrupted when deterioration of the battery 2 is detected by the judging means 3a. Further, activation of the in-vehicle system is prohibited until the engine 5 works. In addition, an actuator 4a is used as an example of the electric load, and a door closer 7 is used as the in-vehicle system as same as the first embodiment. A second threshold value may be set to prohibit actuation of the door closer 7 the if the activation voltage is low and prohibited actuation of the door closer 7 is preferable as same as the third embodiment.

A process for deterioration judgment of the battery 2 and in-vehicle system control according to the fifth embodiment of the present invention will be explained with reference to FIG. 6.

First, as same as the first embodiment, the in-vehicle system control device verifies activation permission for the in-vehicle system, which performs deterioration judgment, prior to activation (step #1). If the in-vehicle system is activation permission state, the in-vehicle system control device monitors system activation request to the in-vehicle system (step #2). If system activation has been requested, the electric load 4 is activated by applying voltage from the battery 2 (step #3). Further, the judging means 3a measures activation voltage E of the battery 2.

Further, deterioration judgment of the battery 2 is carried out by comparing the activation voltage of the battery 2 with the threshold voltage Es (step #4). If the activation voltage E is higher than the threshold value Es, the in-vehicle system control device confirms whether or not a deterioration judgment flag is set to "OFF" (step #11). If the deterioration judgment flag is set to "OFF", the door closer 7 is activated (step #8). If the deterioration judgment flag is set to "ON", the in-vehicle system control device confirms whether or not the engine 5 is working (step #12). When the engine 5 is working, setting of the deterioration judgment flag is changed to "off" (step #13), and the intrinsic constant for controlling the in-vehicle system is restored (step #15), and the door closer 7 is activated (step #8). In the step #12, when the engine 5 is not working, the door closer 7 is activated (step #8). In the step #4, if the activation voltage E is lower than or equal to the threshold value Es, and the intrinsic constant for controlling the in-vehicle system is changed (step #16), and the door closer 7 is activated (step #8). After the in-vehicle system is activated (the step #8 is conducted), the process goes back to the step #2 which is the monitoring step of the in-vehicle system activation. In this step, a second threshold value may be set to prohibit actuation of the door closer 7 if the activation voltage is low and prohibited actuation of the door closer 7 is preferable as same as the third embodiment.

Figure 7:
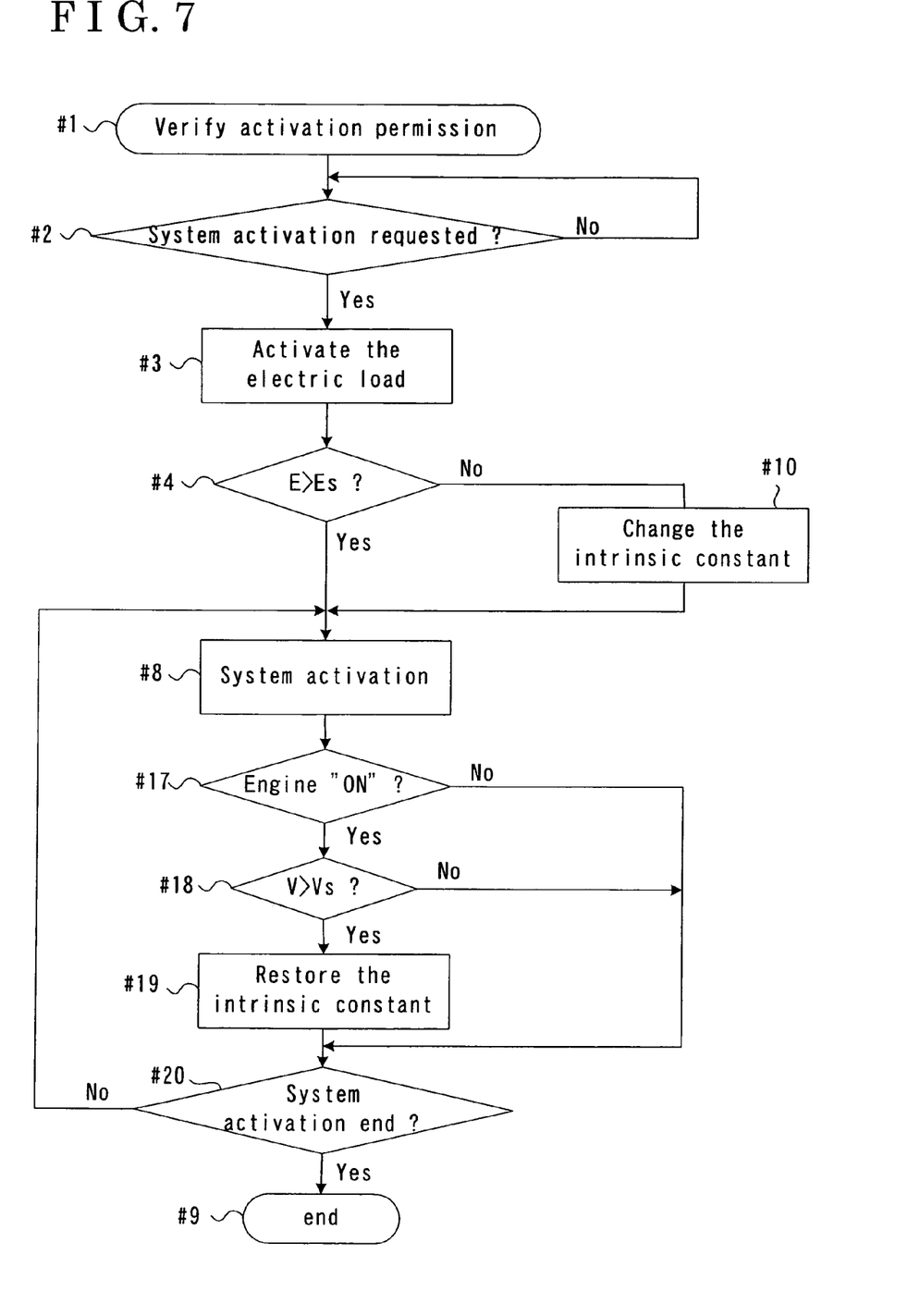
FIG. 7 is a flow chart of a sixth embodiment of an in-vehicle system control device according to the present invention.

(Sixth embodiment) Next, a sixth embodiment of the in-vehicle system control device according to the present invention will be explained. In the sixth embodiment, as same as fifth embodiment, deterioration detection of the battery 2 is interrupted after deterioration of the battery 2 is detected by the judging means 3a. In addition, an actuator 4a is used as an example of the electric load, and a door closer 7 is used as the in-vehicle system as same as the first embodiment.

A process for deterioration judgment of the battery 2 and in-vehicle system control according to the sixth embodiment of the present invention will be explained with reference to FIG. 7.

First, as same as the first embodiment, the in-vehicle system control device verifies activation permission for the in-vehicle system, which performs deterioration judgment, prior to activation (step #1). If the in-vehicle system is activation permission state, the in-vehicle system control device monitors system activation request to the in-vehicle system (step #2). If system activation has been requested, the electric load 4 is activated by applying voltage from the battery 2 (step #3). Further, the judging means 3a measures the activation voltage E of the battery 2.

Further, deterioration judgment of the battery 2 is carried out by comparing the activation voltage of the battery 2 with the threshold voltage Es (step #4). If the activation voltage E is higher than the threshold value Es, the intrinsic constant for controlling the in-vehicle system is changed (step #10). Next, the door closer 7, which is requested to operate, is activated (step #8). The in-vehicle system control device confirms whether or not the engine is working (step #17). When the engine 5 is working, the activation voltage E of the battery 2 is compared with the threshold value Es (step #18). If the activation voltage E is higher than the threshold value Es, the intrinsic constant for controlling the in-vehicle system is restored (step #19). The in-vehicle system control device confirms whether or not the door closer 7 is working (step #20). If activation of the door closer 7 is not completed, the process goes back to the step #8. If activation of the door closer 7 is completed, the process is ended (step #20).

Although the in-vehicle system control device is provided in the in-vehicle controller 3 in the above mentioned embodiments (from the first embodiment to the sixth embodiment), a special device may be provided for exclusive use. If plural in-vehicle controller 3 is equipped in the vehicle 1, plural in-vehicle system control devices may be provided to each in-vehicle controller 3, or one of the in-vehicle controllers 3 may be used so as to process above mentioned embodiments. In addition, the electric load 4 may be selected within in-vehicle system, and new electric load may be used for exclusive use.

Figure 8:
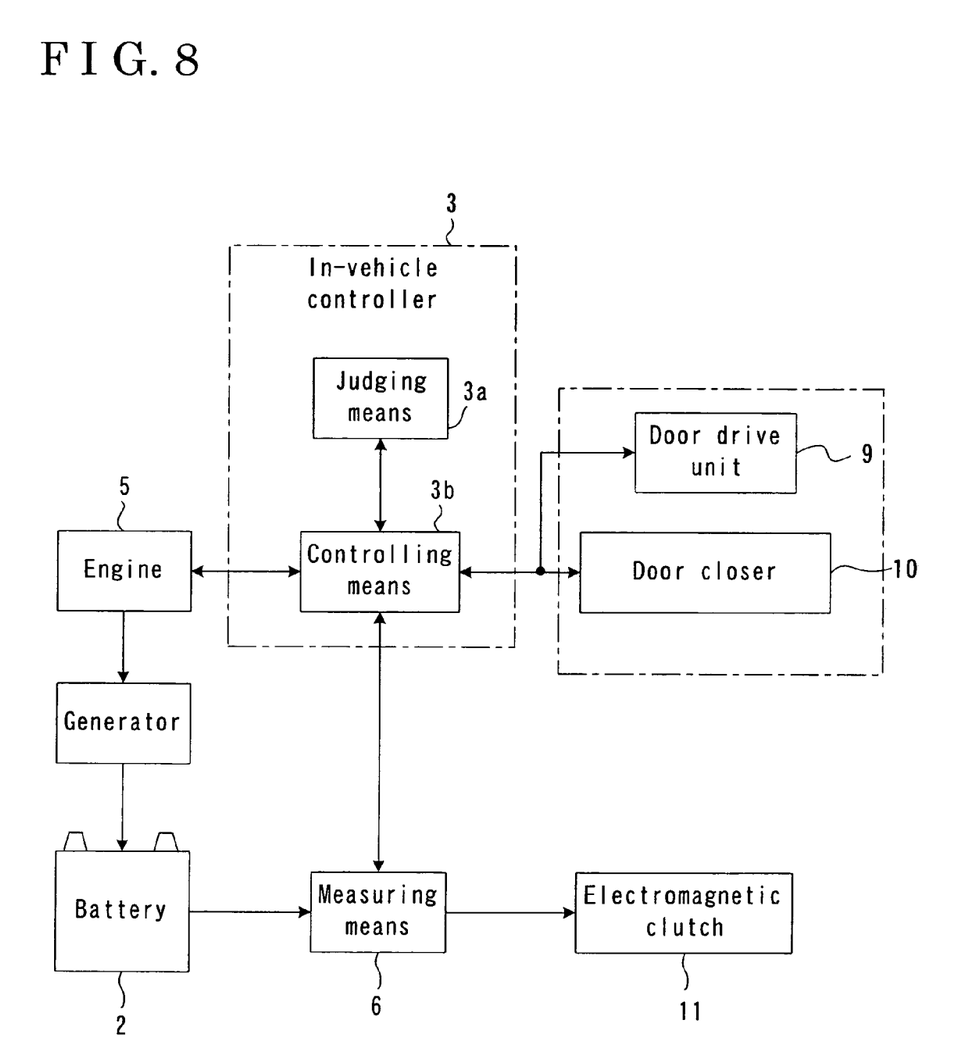
FIG. 8 is a block diagram illustrating an in-vehicle system control device according to a seventh embodiment of the present invention.

(Seventh embodiment) Next, a seventh embodiment of the in-vehicle system control device according to the present invention will be explained with reference to FIG. 8. Although the door closer 7 and the lock mechanism 8 are took as examples in the above mentioned embodiments (from the first embodiment to the sixth embodiment), the in-vehicle system control device according to the present invention may be applied to another devices such as an in-vehicle system which operates automatic opening/closing of a back door and an in-vehicle system which automatically controls a slide door. In the seventh embodiment, a door drive unit 9 and a closer 10 which has release function are used as an example of an in-vehicle system, and an electromagnetic clutch 11 is used as an example of an electric load.

The door drive unit 9 is conformed so as to drive the door in opening direction, closing direction, or both opening and closing directions in response to a command given by the in-vehicle controller 3. The electromagnetic clutch 11 transmits operating condition of the door drive unit 9, or disables operating condition of the door drive unit 9. The controlling means 3b controls the in-vehicle system using one of controlling methods which is shown in figures from FIG. 3 to FIG. 7.

The invention claimed is:

1. An in-vehicle system control device, which controls an in-vehicle system mounted in a vehicle, comprising:
   an electric load electrically connected to a battery for activating the in-vehicle system; and
   a judging means electrically connected to the electric load;
   wherein the judging means detects activating voltage of a battery for activating the in-vehicle system by applying a voltage from the battery to the electric load connected to the battery before activating the in-vehicle system, and judges whether or not the battery is in deteriorated condition on the basis of a predetermined judging condition.

2. An in-vehicle system control device according to claim 1, wherein the electric load is composed of singular load device.

3. An in-vehicle system control device according to claim 2, wherein the in-vehicle system is not activated by the battery when the judging means detects deterioration of the battery.

4. An in-vehicle system control device according to claim 2, wherein the judging means changes setting of an intrinsic constant for controlling the in-vehicle system when the judging means detects deterioration of the battery.

5. An in-vehicle system control device according to claim 2, wherein detection of battery deterioration is prohibited after the judging means detects deterioration of the battery, and the in-vehicle system is not activated by the battery until an internal combustion engine of the vehicle is activated.

6. An in-vehicle system control device according to claim 2, wherein detection of battery deterioration is prohibited after the judging means detects deterioration of the battery, and the judging means changes setting of an intrinsic constant for controlling the in-vehicle system until an internal combustion engine of the vehicle is activated.

7. An in-vehicle system control device according to claim 1, wherein at least one electric component forming the in-vehicle system is not activated with turning on the electric load.

8. An in-vehicle system control device according to claim 7, wherein the in-vehicle system is not activated by the battery when the judging means detects deterioration of the battery.

9. An in-vehicle system control device according to claim 7, wherein the judging means changes setting of an intrinsic constant for controlling the in-vehicle system when the judging means detects deterioration of the battery.

10. An in-vehicle system control device according to claim 7, wherein detection of battery deterioration is prohibited after the judging means detects deterioration of the battery, and the in-vehicle system is not activated by the battery until an internal combustion engine of the vehicle is activated.

11. An in-vehicle system control device according to claim 7, wherein detection of battery deterioration is prohibited after the judging means detects deterioration of the battery, and the judging means changes setting of an intrinsic constant for controlling the in-vehicle system until an internal combustion engine of the vehicle is activated.

12. An in-vehicle system control device according to claim 1, wherein the in-vehicle system is not activated by the battery when the judging means detects deterioration of the battery.

13. An in-vehicle system control device according to claim 1, wherein the judging means changes setting of an intrinsic constant for controlling the in-vehicle system when the judging means detects deterioration of the battery.

14. An in-vehicle system control device according to claim 1, wherein detection of battery deterioration is prohibited after the judging means detects deterioration of the battery, and the in-vehicle system is not activated by the battery until an internal combustion engine of the vehicle is activated.

15. An in-vehicle system control device according to claim 1, wherein detection of battery deterioration is prohibited after the judging means detects deterioration of the battery, and the judging means changes setting of an intrinsic constant for controlling the in-vehicle system until an internal combustion engine of the vehicle is activated.

* * * * *